(12) United States Patent
Alfano et al.

(10) Patent No.: US 10,290,606 B2
(45) Date of Patent: May 14, 2019

(54) INTERPOSER WITH IDENTIFICATION SYSTEM

(75) Inventors: Michael Alfano, Austin, TX (US); Joe Siegel, Brookline, MA (US); Michael Z. Su, Round Rock, TX (US); Bryan Black, Spicewood, TX (US); Julius Din, Reedley, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 723 days.

(21) Appl. No.: 13/529,736

(22) Filed: Jun. 21, 2012

(65) Prior Publication Data

US 2013/0341783 A1 Dec. 26, 2013

(51) Int. Cl.
*H01L 21/50* (2006.01)
*H01L 23/52* (2006.01)
*H01L 23/00* (2006.01)
*H01L 23/498* (2006.01)
*H01L 23/538* (2006.01)
*H01L 23/544* (2006.01)
*H01L 21/66* (2006.01)
*H01L 25/065* (2006.01)
*H01L 23/14* (2006.01)

(52) U.S. Cl.
CPC ........ *H01L 24/97* (2013.01); *H01L 23/49827* (2013.01); *H01L 23/5382* (2013.01); *H01L 23/544* (2013.01); *H01L 22/14* (2013.01); *H01L 22/20* (2013.01); *H01L 23/147* (2013.01); *H01L 23/49822* (2013.01); *H01L 24/16* (2013.01); *H01L 25/0652* (2013.01); *H01L 25/0655* (2013.01); *H01L 2223/5444* (2013.01); *H01L 2223/54446* (2013.01); *H01L 2223/54453* (2013.01); *H01L 2223/54473* (2013.01); *H01L 2223/54486* (2013.01); *H01L 2224/1134* (2013.01); *H01L 2224/13111* (2013.01); *H01L 2224/13139* (2013.01); *H01L 2224/13144* (2013.01); *H01L 2224/13164* (2013.01); *H01L 2224/13169* (2013.01); *H01L 2224/16145* (2013.01); *H01L 2224/16225* (2013.01); *H01L 2224/16227* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2924/01322* (2013.01); *H01L 2924/12042* (2013.01); *H01L 2924/15311* (2013.01)

(58) Field of Classification Search
CPC ................. H01L 23/52; H01L 2223/5444
See application file for complete search history.

(56) References Cited

U.S. PATENT DOCUMENTS 6,842,443 B2    1/2005  Allen, Jr. et al.
7,198,980 B2    4/2007  Jiang et al.
(Continued)

OTHER PUBLICATIONS

U.S. Appl. No. 13/221,465, filed Aug. 30, 2011, Loh et al.

*Primary Examiner* — Mounir S Amer
(74) *Attorney, Agent, or Firm* — Timothy M. Honeycutt

(57) ABSTRACT

Various interposers and method of manufacturing related thereto are disclosed. In one aspect, a method of manufacturing is provided that includes coupling an identification structure to an interposer. The identification structure is operable to provide identification information about the interposer. The identification structure is programmable to create or alter the identification information.

19 Claims, 4 Drawing Sheets

(56) References Cited

U.S. PATENT DOCUMENTS

| | | | |
|---|---|---|---|
| 7,522,538 B2 | 4/2009 | Rhim et al. | |
| 8,189,612 B2 | 5/2012 | Lemaire et al. | |
| 8,296,459 B1 | 10/2012 | Brandwine et al. | |
| 8,300,641 B1 | 10/2012 | Vincent et al. | |
| 2003/0189924 A1 | 10/2003 | Kadambi et al. | |
| 2005/0167798 A1 | 8/2005 | Doan | |
| 2005/0280503 A1* | 12/2005 | Lee | H01L 23/544 |
| | | | 340/10.1 |
| 2006/0227587 A1* | 10/2006 | Nakamura | G11C 5/04 |
| | | | 365/63 |
| 2008/0016243 A1 | 1/2008 | Basso et al. | |
| 2008/0018350 A1* | 1/2008 | Chao et al. | 324/754 |
| 2008/0265389 A1* | 10/2008 | Hsu et al. | 257/686 |
| 2011/0071662 A1* | 3/2011 | Yokosawa | H01L 21/67294 |
| | | | 700/114 |
| 2012/0051019 A1* | 3/2012 | Park et al. | 361/783 |
| 2012/0273782 A1* | 11/2012 | Goel | H01L 22/32 |
| | | | 257/48 |
| 2012/0278674 A1* | 11/2012 | Whetsel | G01R 31/318533 |
| | | | 714/727 |
| 2012/0319717 A1 | 12/2012 | Chi | |
| 2013/0047049 A1* | 2/2013 | Chen | G01B 31/318536 |
| | | | 714/733 |
| 2013/0106459 A1* | 5/2013 | Tseng et al. | 324/759.01 |

\* cited by examiner

INTERPOSER WITH IDENTIFICATION SYSTEM

BACKGROUND OF THE INVENTION

1. Field of the Invention

This invention relates generally to semiconductor processing and devices, and more particularly to interposer-based semiconductor chip devices, and methods of making and using the same.

2. Description of the Related Art

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Still another technical challenge associated with stacked semiconductor chips is testing.

Semiconductor interposers are sometimes used to serve as a supporting and interconnect substrates for one or more semiconductor chips. A conventional semiconductor interposer consists of a silicon substrate and metallization to provide electrical pathways.

A process flow to transform bare semiconductor wafers into collections of interposers and chips and then mount the semiconductor chips on those interposers, and in-turn the interposers on circuit boards, involves a large number of individual steps. Because the processing and mounting of a semiconductor interposer proceeds in a generally linear fashion, that is, various steps are usually performed in a specific order, it is desirable to be able to identify defective parts as early in a flow as possible. In this way, defective parts may be identified so that they do not undergo needless additional processing. If, for example, the first semiconductor chip mounted to an interposer is revealed to be defective only after several other semiconductor chips are stacked thereon, then all of the material processing steps and the materials associated with the later-mounted chips may have been wasted.

Conventional interposers do not contain active devices, which might enable programming of specific identification information, such as the current processing state, the defect status, etc., of the interposers. There are conventional identification techniques, such as hard-coded metal strapping at the wafer stage and bar coding after final assembly. However, there is no ability to provide intermediary process identification information, such as defect status, customer return status, etc.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes coupling an identification structure to an interposer. The identification structure is operable to provide identification information about the interposer. The identification structure is programmable to create or alter the identification information.

In accordance with another aspect of an embodiment of the present invention, a method of manufacturing is provided that includes engaging an interposer that has an identification structure that is operable to provide identification information about the interposer. The identification structure is programmed to create or alter the identification information.

In accordance with another aspect of an embodiment of the present invention, an apparatus is provided that includes an interposer that has an identification structure operable to provide identification information about the interposer. The identification structure is programmable to create or alter the identification information.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various interposers useful for mounting multiple semiconductor chips are disclosed. The interposers include identification structures that provide identification information about the interposers. The identification structures are programmable to create or alter the identification information. This may be useful to change the identification information to reflect some particular processing state of the interposers. Example identification structures include fuses, components attached to the interposer, metal straps or a wireless transmission system. Additional details will now be described.

Figure 1:
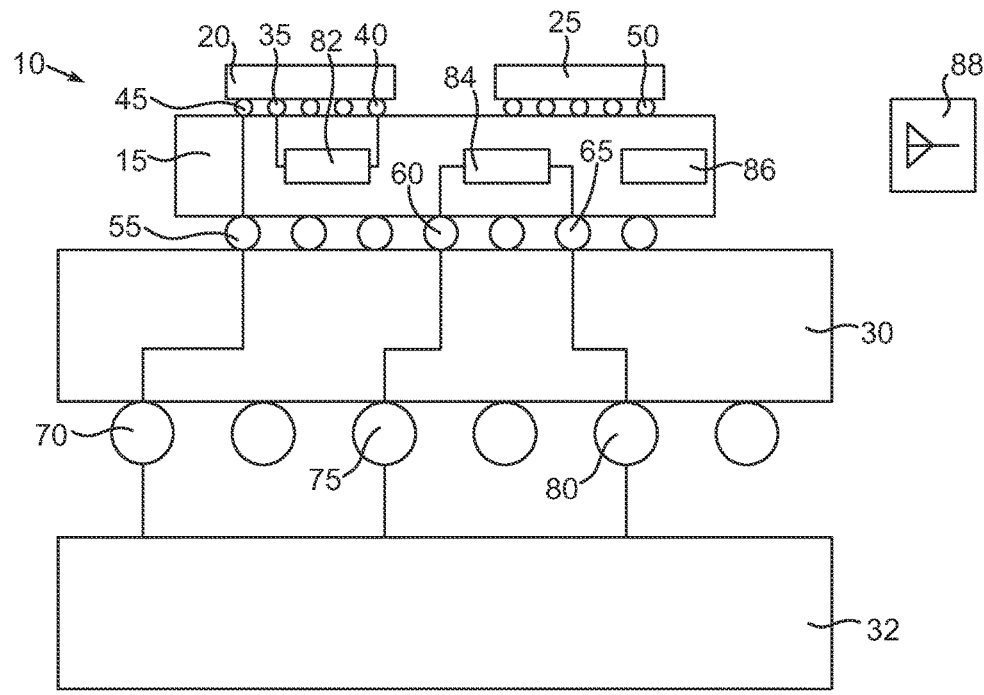
FIG. 1 is a block diagram of an exemplary embodiment of a semiconductor chip device that includes an interposer and one or more semiconductor chips.

In the drawings described below, reference numerals are generally repeated where identical elements appear in more than one figure. Turning now to the drawings, and in particular to FIG. 1, therein is shown a block diagram of an exemplary embodiment of a semiconductor chip device 10 that includes an interposer 15, one or more semiconductor chips 20 and 25, a substrate 30 and an optional electronic device 32. The interposer 15 may be mounted on the substrate 30 and the semiconductor chips 20 and 25 on the interposer 15. In this way, the interposer 15 may be operable to transmit power, ground and signals between the semiconductor chips 20 and 25 and the underlying substrate 30. The configuration of the interposer 15 is subject to great variety. For example, the interposer 15 may be simply another semiconductor chip as opposed to purely an interposer. The semiconductor chip device 10 may be used to implement a large number of different functions. Thus, the semiconductor chips 20 and 25 may be selected from numerous types of integrated circuits. Examples include microprocessors, graphics processors, combined microprocessor/graphics processors, application specific integrated circuits, memory devices, active optical devices, such as lasers, or the like, and may be single or multi-core. The semiconductor chips 20 and 25 may be constructed of bulk semiconductor, such as silicon or germanium, or semiconductor on insulator materials, such as silicon-on-insulator materials.

The interposer 15 may take on a variety of configurations. If typically configured, the interposer 15 may consist of a substrate of a material(s) with a coefficient of thermal expansion (CTE) that is near the CTE of the semiconductor chips 20 and 25 and that includes plural internal conductor traces and vias for electrical routing. Various semiconductor materials may be used, such as silicon, germanium or the like. Silicon has the advantage of a favorable CTE and the widespread availability of mature fabrication processes. Of course, the interposer 15 could also be fabricated as an integrated circuit like the other semiconductor chips 20 and 25. In either case, the interposer 15 could be fabricated on a wafer level or chip level process. Indeed, the semiconductor chips 20 and 25 could be fabricated on either a wafer or chip level basis, and then singulated and mounted to an interposer 15 that has not been singulated from a wafer. Singulation of the interposer 15 would follow mounting of the semiconductor chips 20 and 25. The interposer 15 includes plural electrical pathways to transmit power, ground and signals. A few of these pathways are illustrated schematically by the black lines. The black lines may consist of plural conductive traces interconnected by conductive vias or may be single level types of metallization structures.

Similarly, the substrate 30 may take on a variety of configurations. Examples include a semiconductor chip package substrate, a circuit card, another interposer, or virtually any other type of printed circuit board. Although a monolithic structure could be used for the substrate 30, a more typical configuration will utilize a buildup design. In this regard, the substrate 30 may consist of a central core upon which one or more buildup layers are formed and below which an additional one or more buildup layers are formed. The core itself may consist of a stack of one or more layers. If implemented as a semiconductor chip package substrate, the number of layers in the substrate 30 can vary from four to sixteen or more, although less than four may be used. So-called "coreless" designs may be used as well. The layers of the substrate 30 may consist of an insulating material, such as various well-known epoxies, interspersed with metal interconnects. A multi-layer configuration other than buildup could be used. Optionally, the substrate 30 may be composed of well-known ceramics or other materials suitable for package substrates or other printed circuit boards. The substrate 30 is provided with a number of electrical pathways to transmit power, ground and signals. A few of these pathways are illustrated schematically by the black lines.

The electronic device 32 may be a general purpose computer, a digital television, a handheld mobile device, a server, a memory device, an add-in board such as a graphics card, or any other computing device employing semiconductors. Other options include testing apparatus, such as probe testers, or virtually any other type of diagnostic apparatus.

The semiconductor chips 20 and 25 may interface electrically with the interposer 15 by way of plural interconnect structures, four of which are labeled 35, 40, 45 and 50. The interconnect structures 35, 40, 45 and 50 may be solder bumps, micro bumps, conductive pillars, wire bonds or the like. Exemplary solder materials include lead-based solders at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. These compositions may be varied. Micro bumps may be fabricated from gold, silver, platinum, palladium, copper, combinations of these or others. Conductive pillars may be made from the same materials.

The interposer 15 may interface electrically with the substrate 30 by way of plural interconnect structures, three of which are labeled 55, 60 and 65. The interconnect structures 55, 60 and 65 may be configured like and constructed of the same types of materials as the interconnect structures 35, 40, 45 and 50.

The substrate 30 may interface electrically with the electronic device 32 by way of plural interconnect structures, three of which are labeled 70, 75 and 80. The interconnect structures 70, 75 and 80 may be solder balls, pins of a pin grid array, lands of a land grid array or other types of interconnect structures. The types of solders described above may be used for a ball grid array.

The interposer 15 may include one or more identification (ID) structures 82, 84 and 86. Three such ID structures 82, 84 and 86 are depicted, but the number may be more or less than three. The ID structures 82, 84 and 86 are designed to provide certain identification information about the interposer 15 that can be used in a variety of ways to be described in detail below. The types of ID information are legion. A non-exhaustive list of exemplary ID information is provided in the following table:

TABLE

| |
|---|
| Identification of interposer manufacturer |
| Identification of interposer wafer |
| Identification of interposer wafer lot |
| Identification of physical location of interposer on interposer wafer (i.e., coordinates) prior to singulation |
| Identification of particular post-singulation processing on a given interposer |
| Identification of known defect(s) for a given interposer |
| Identification of physical size and/or number of I/O's for a given interposer |

The ID information supplied by the ID structures 82, 84 and 86 may be read in a variety of ways. For example, the ID structure 82 is designed to be read by the semiconductor chip 20. This may be accomplished by tying the ID structure 82 to the interconnect structures 35 and 40. Logic onboard the semiconductor chip 20 is operable to read the ID information from the ID structure 82 and output a signal at the interconnect structure 45 based on the ID information. The output signal is transmitted through an electrical pathway of the interposer 15 connected to the interconnect structure 55, and from there to the interconnect structure 70 through an electrical pathway of the substrate 30, and finally to the electronic device 32.

The ID information from the ID structure 84 may be read in a different way as desired. For example, the ID structure 84 may be tied electrically to the interconnect structures 60 and 65. The interconnect structures 60 and 65 are tied electrically to the interconnect structures 75 and 80. In this way, the electronic device 32 may directly read the identification output of the ID structure 84. Finally, the ID structure 86 may be implemented as a RFID device or other wireless device that may be read by an external RFID reader 88 or other device.

Figure 2:
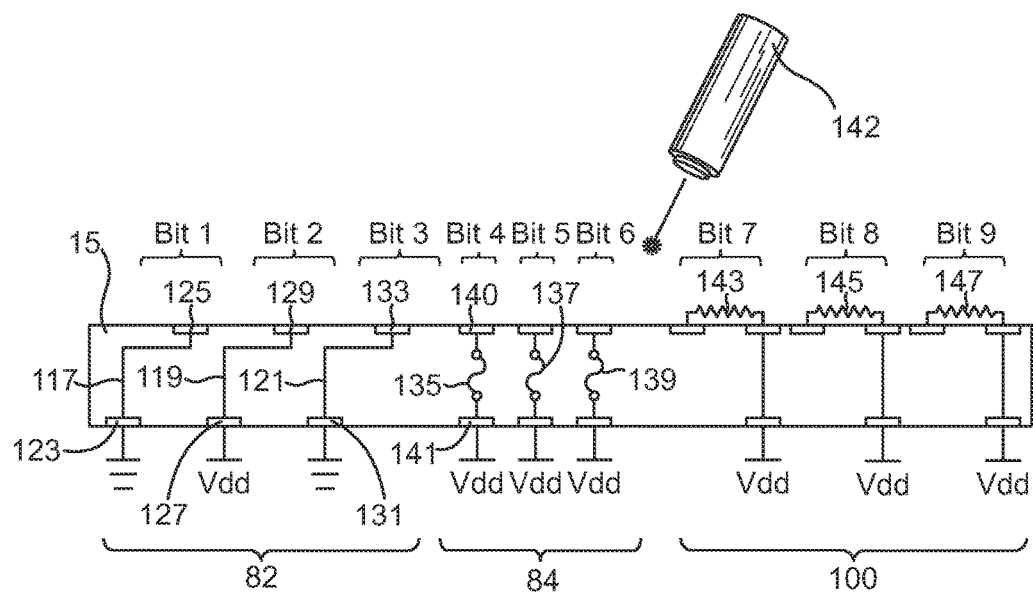
FIG. 2 is a schematic view of an exemplary embodiment of an interposer.

Additional details of the interposer 15, the ID structures 82 and 84 and an additional exemplary ID structure 100 may be understood by referring now to FIG. 2, which is a schematic view. FIG. 2 is intended to illustrate a few of the possible types of circuit elements that may be used to construct an ID structure. In this illustrative embodiment, the ID structure 82 may include three conductor straps 117, 119 and 121. The conductor straps 117, 119 and 121 are simply conductive pathways through (or on) and connected to respective sets of I/O pads 123 and 125, 127 and 129, and 131 and 133 of the interposer 15. Any or all of the conductor straps 117, 118 and 121 could be surface traces if desired. The conductor straps 117, 119 and 121 may be tied to known bias levels, such as ground or power (Vdd) to represent Bits 1, 2 and 3 of an overall nine bit identification system, where the bit value is set by either Vdd or ground. For example, ground may be used to designate zero values for Bit 1 and Bit 3, and Vdd may be used to represent a value of 1 for Bit 2.

The ID structure 84 may consist of three programmable fuses 135, 137 and 139. The fuses 135, 137 and 139 may include the same types of conductor pads used for the conductor straps 117, 119 and 121, though only conductor pads 140 and 141 of the fuse 135 are labeled. One input of each of the fuses 135, 137 and 139 may be tied to a known bias, such as Vdd. The fuses 135, 137 and 139 may be programmed by a laser source 142 or other stimulus to again represent a 1 or a 0 for Bits 4, 5 and 6 of the nine bit data system.

Finally, the ID structure 100 may consist of discrete components 143, 145 and 147. The components 143, 145 and 147 may be resistors, capacitors, inductors, integrated circuits, such as read only memories or erasable programmable memories, or other components. The components 143, 145 and 147 may each receive an input of a known bias, such as Vdd, and the resistance, capacitance, inductance or other parameters of the components 143, 145 and 147 read by any of the techniques disclosed above to generate values for Bits 7, 8 and 9 of the nine bit data system. A translation scheme may be developed where a particular parameter value at a particular I/O position on the interposer 15 may represent some particular piece of data. The skilled artisan will appreciate that the ID structures 82, 84 and 100 may each be implemented as conductor straps, fuses, components or combinations of these. In addition, more or less than nine bits may be used. Greater numbers of bits can provide more information about the interposer 15.

Figure 3:
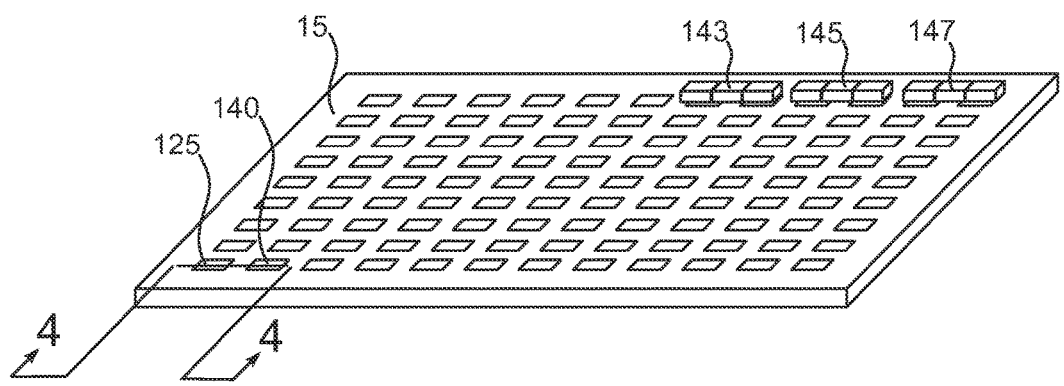
FIG. 3 is a pictorial view of an exemplary embodiment of an interposer.

An exemplary physical implementation of the interposer 15 depicted schematically in FIG. 2 may be understood by referring now to FIG. 3, which is a pictorial view. Here, the interposer 15 is provided with the three surface components 143, 145 and 147. The upper surface of the interposer 15 is populated with a number of I/O pads, such as the I/O pads 125 and 140 described above. The number of I/O pads, 125, 140, etc. may vary greatly depending on the complexity of the interposer 15. Furthermore, not all of the I/O pads 125, 140, etc., are devoted to ID structures but instead will be used to provide I/O functionality for whatever semiconductor chips are mounted on the interposer 15.

Figure 4:
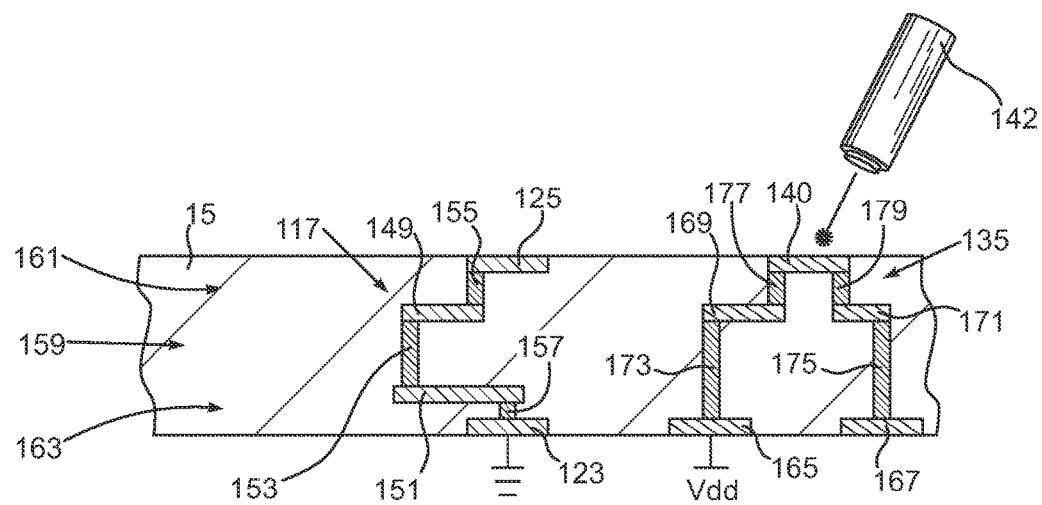
FIG. 4 is a sectional view of FIG. 3 taken at section 3-3.

Additional details of the structures associated with the I/O pads 125 and 140 may be understood by referring now to FIG. 4, which is a sectional view of FIG. 3 taken at section 4-4. The I/O pad 125 is connected to the conductor strap 117. The conductor strap 117 is, in turn, connected to the I/O pad 123, which is tied to ground. Here, the conductor strap 117 is depicted as including conductive traces 149 and 151 interconnected vertically by way of conductive vias 153, 155 and 157. Of course, the skilled artisan will appreciate that the conductive strap 117 may be implemented in a large variety of ways and still carry out the function of simply providing a conductive pathway that is at some known bias level, such as ground or Vdd. The conductive strap 117 may be fabricated using well-known fabrication materials and techniques for metallization structures in a semiconductor interposer, such as for example, copper, aluminum, titanium, tungsten, gold, silver, platinum, palladium, combinations or others, and chemical vapor deposition, plating, physical vapor deposition or the like. It should be understood that the interposer 115 may include a semiconductor core or body at 159 and metallization layers at 161 and 163 that may include stacked interlevel dielectric layers along with metallization. The dielectric layers at 161 and 163 may be composed of silicon dioxide, silicon nitride, low-K and ultra low-K materials, such as porous carbon doped oxides (p-SiCOH), nano porous organosilicate and black diamond.

The I/O pad 140 may actually serve as the programmable element of the programmable fuse 135. One input of the programmable fuse 135 may be a conductor pad 165 tied to Vdd and another conductor pad 167 may serve as another I/O. The pad 140 and the pads 165, 167 may be initially tied electrically by way of conductor traces 169 and 171 and conductive vias 173, 175, 177 and 179. Here again the layout of the conductive structures between the pad 140 and the pads 165 and 167 may vary greatly depending upon the complexity of the interposer. The conductor pad 140 may be programmed or otherwise blown by way of the laser source 142 or other stimulus, which may be used to cut the conductor pad 140 and create an open circuit. The various conductor structures of the fuse 35 may be fabricated from the same materials and using the same techniques as the conductor structures of the strap 117 just described. However, aluminum may be a preferred material for the conductor pad 140, since aluminum tends to attract less dust than other conductors.

Attention is turned again to FIGS. 1 and 2. Programming of the ID structures 82, 84 and 86, for example, will typically involve engaging the interposer 15 by some mechanism, such as a processing station or other device, and performing an appropriate programming operation. This might entail laser fuse programming, component attach or even detach, a resistance altering trim operation, a programming of the RFID ID structure 86 or other operation. These steps may be performed to provide or alter the ID information.

Figure 5:
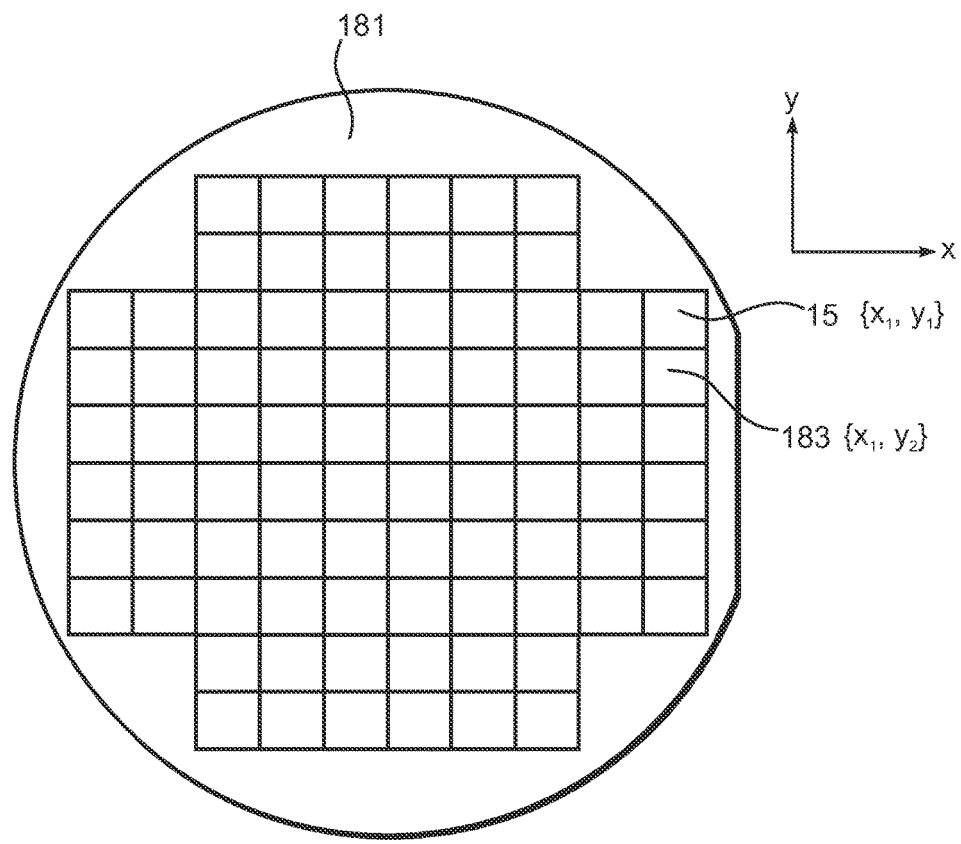
FIG. 5 is a plan view of an exemplary semiconductor wafer including plural interposers.

The ID structures described herein may be used to provide various types of identification information for an interposer even before singulation from a semiconductor wafer or workpiece. For example, FIG. 5 depicts a plan view of an exemplary semiconductor wafer 181 that includes the interposer 15 and a plurality of other interposers, another of which is labeled 183. Any of the disclosed ID structures may be implemented on the interposer 15 either formed or otherwise programmed to output information such as the x-y coordinates $\{x_1, y_1\}$ of the interposer 15 and the x-y coordinates $\{x_1, y_1\}$ of another interposer, such as the interposer 183, and so on for the other unlabeled interposers. In this way, a given interposer 15 may be identified as to specific location on the semiconductor wafer 181. This information may be useful, particularly in circumstances where a process debug must be accomplished to quickly track down the problematic processing locations on the semiconductor wafer.

Figure 6:
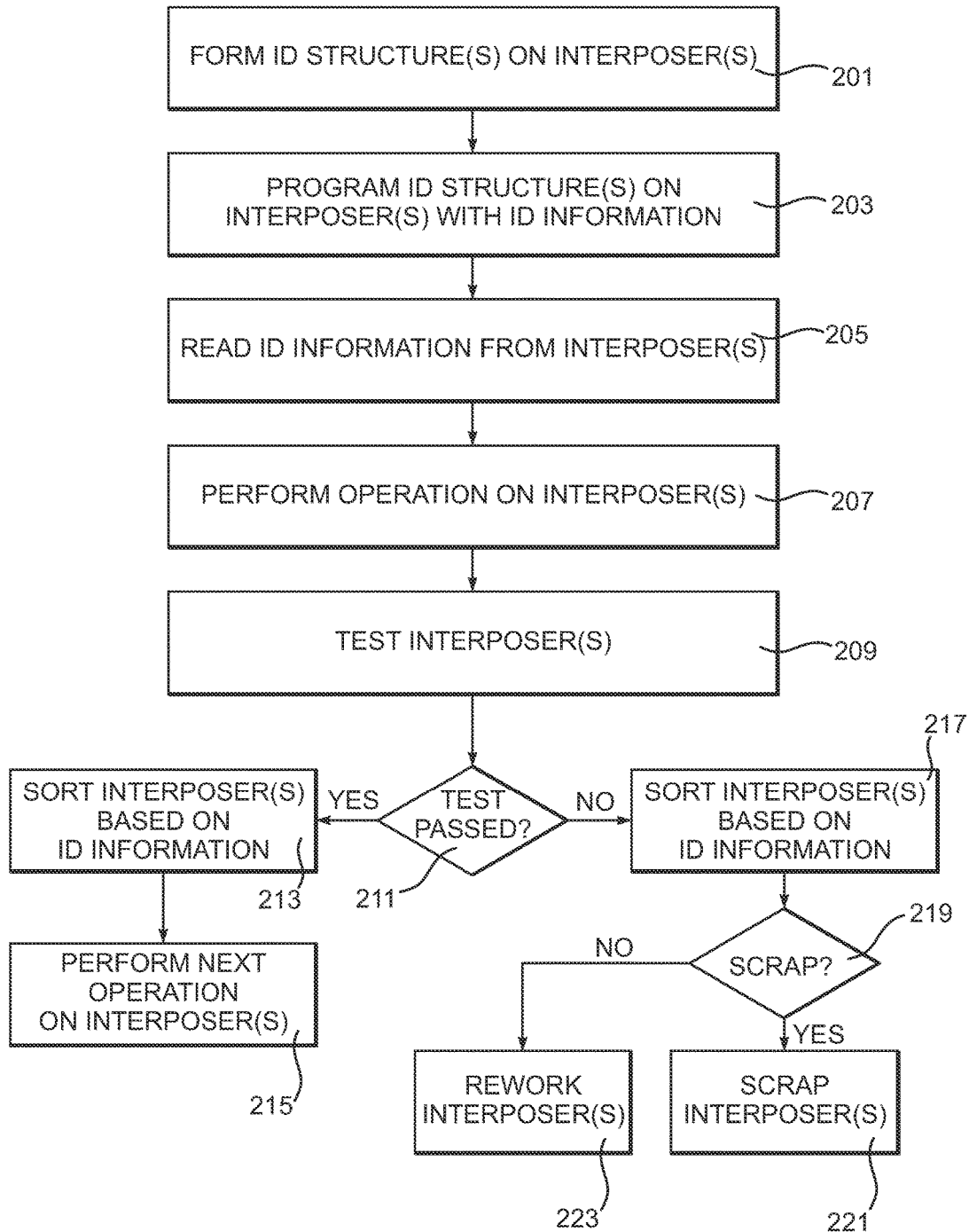
FIG. 6 is a flow chart depicting an exemplary method of using interposer-based identification information.

The interposer-based ID structures described herein may be used in a great variety of ways to facilitate process debug, testing and a variety of other activities. FIG. 6 depicts a flow chart of one exemplary process flow utilizing interposer-based ID structures. At step 201, ID structures are formed on an interposer. This may entail the fabrication of the aforementioned conductor straps 117, 119 and 121 depicted in FIG. 2, or the fabrication of the fuses 135, 137 and 139 or even the mounting of the components 143, 145 and 147. At step 203, the ID structures are programmed with ID information. In the case of a conductor strap-type ID structure, this programming will entail tying the particular ID structure or strap to power ground or some other known bias level that has some recognized meaning. For a fuse-based ID structure, this programming step will entail the selective manipulation of one or more fuses to represent certain state levels. At step 205, the ID information is read from the ID structures on the interposer. This may be done in any of the ways described herein, such as by way of a semiconductor chip mounted on the interposer, by way of direct electrical connection between the ID structure in the interposer and a test device such as the electronic device 32 depicted in FIG. 1 or other technique. At step 207, some operation is performed on the interposer. This might include a process step, such as a material deposition or etching step or perhaps the mounting of a semiconductor chip. At step 209, a test is performed on the interposer. For example, a material deposition or etching process may be performed on the interposer and thereafter the test performed on the interposer to determine post fabrication process step functionality. If the interposer passes the test at step 211, then the qualified interposers may be sorted at step 213 based upon the ID information read at step 205. Following the sorting of the interposers at step 213, a subsequent operation may be performed on those qualified and sorted interposers at step 215. This might be, for example, another fabrication process such as a deposition or etching process or I/O connect or other type of step. If however, at step 211, the tested interposers do not pass, then those failed interposers may be sorted at step 217, again based on the ID information read at step 205. In this way, those interposers that fail the test at step 209 may be sorted with other failing interposers based on the ID information gleaned at step 205. Following the sorting of the failed interposers at step 217, a decision may be made at step 219 to scrap the failed interposers. If so, the interposers may be scrapped at step 221. Alternatively, a decision may be made at step 219 not to go to scrap, but instead go to a rework step or steps at step 223 in an attempt to rework the interposers. It should be understood that this process flow depicted in FIG. 6 and just described represents just one possible usage of the ID structures for an interposer.

It should be understood that steps 203 and 205 can be repeated at various points. For example, an interposer ID structure may be programmed or reprogrammed after a particular process step is performed so that the fabrication status of the interposer at many way points during fabrication, intermediate and final assembly may be quickly determined.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
coupling an identification structure to an interposer, the identification structure being operable to provide an output that identifies the interposer; and
wherein the identification structure includes a multi-bit data system and is programmable to create or alter the output and the output can include bits with a combination of both logic 1 and logic 0 values.

2. The method of claim 1, wherein the coupling comprises forming the identification structure and whereby the formed identification structure forms part of the interposer.

3. The method of claim 1, wherein the coupling comprises attaching the identification structure to the interposer.

4. The method of claim 1, wherein the identification structure comprises a fuse, a component mounted on the interposer or a wireless transmission device.

5. The method of claim 4, wherein the identification structure comprises a conductor strap on or in the interposer.

6. The method of claim 1, comprising mounting a semiconductor chip on the interposer.

7. The method of claim 6, wherein the semiconductor chip is operable to read the output.

8. The method of claim 1, comprising mounting the interposer on a substrate.

9. The method of claim 1, comprising electrically connecting an electronic device to the interposer, the electronic device being operable to read the output.

10. A method of manufacturing, comprising:
engaging an interposer having an identification structure operable to provide an output that identifies the interposer, the identification structure including a multi-bit data system and the output can include bits with a combination of both logic 1 and logic 0 values; and
programming the identification structure to create or alter the output.

11. The method of claim 10, wherein the identification structure comprises a fuse, a component mounted on the interposer or a wireless transmission device.

12. The method of claim 11, wherein the identification structure comprises a conductor strap on or in the interposer.

13. The method of claim 10, comprising mounting a semiconductor chip on the interposer.

14. The method of claim 13, comprising reading the output with the semiconductor chip.

15. The method of claim 10, comprising mounting the interposer on a substrate.

16. The method of claim 10, comprising electrically connecting an electronic device to the interposer and using the electronic device to read the output.

17. The method of claim 10, comprising programming the output based on a process step performed on the interposer.

18. The method of claim 17, comprising performing the process step on the interposer.

19. The method of claim 10, comprising sorting the interposer based on the output.

* * * * *